(12) United States Patent
Park

(10) Patent No.: US 6,737,330 B2
(45) Date of Patent: May 18, 2004

(54) ISOLATION STRUCTURE AND FABRICATING METHOD THEREFOR

(75) Inventor: Sung-Kye Park, Cheongju-shi (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 10/259,872

(22) Filed: Sep. 30, 2002

(65) Prior Publication Data

US 2003/0022453 A1 Jan. 30, 2003

Related U.S. Application Data

(62) Division of application No. 09/527,686, filed on Mar. 17, 2000, now Pat. No. 6,479,361.

(30) Foreign Application Priority Data

Mar. 18, 1999 (KR) .......................................... 1999-9146

(51) Int. Cl.[7] .............................................. H01L 21/20
(52) U.S. Cl. ...................................... 438/396; 438/510
(58) Field of Search ................................ 438/396, 510, 438/637, 639, 640, 647, 649; 257/396, 510, 637, 639, 640, 647, 649, 68, 296

(56) References Cited

U.S. PATENT DOCUMENTS

| | | |
|---|---|---|
| 4,104,086 A | 8/1978 | Bondur et al. |
| 4,356,211 A | 10/1982 | Riseman |
| 4,571,819 A * | 2/1986 | Rogers et al. ................. 29/576 |
| 5,728,621 A * | 3/1998 | Zheng et al. ................ 438/427 |
| 6,121,113 A * | 9/2000 | Takatsuka et al. .......... 438/424 |

* cited by examiner

*Primary Examiner*—David Nhu
(74) *Attorney, Agent, or Firm*—Birch, Stewart, Kolasch & Birch, LLP

(57) ABSTRACT

A semiconductor device isolation structure and a fabricating method therefor are disclosed. The isolation structure includes a trench which is formed on an isolating region to define an active region. First, second, and third insulating layers are deposited in the trench. The second insulating layer has an etch selection ratio different from those of the first and third insulating layers. The edge portions of the third insulating layer which contact the side walls of the trench characteristically do not show any collapse. Therefore, when supplying a subthreshold voltage, a hump phenomenon does not occur. As a result, leakage current is kept from increasing, and the device refresh characteristic can be kept from deteriorating. Further, the third insulating layer covers the top edge portions of the trench. Therefore, the gate insulating layer (which is formed later) has a sufficient thickness. Therefore, yield voltage characteristics can be kept from deteriorating.

7 Claims, 4 Drawing Sheets

ISOLATION STRUCTURE AND FABRICATING METHOD THEREFOR

This application is a divisional of application Ser. No. 09/527,686, filed on Mar. 17, 2000, now U.S. Pat. No. 6,479,361, the entire contents of which are hereby incorporated by reference and for which priority is claimed under 35 U.S.C. § 120; and this application claims priority of Application No. 99-9146 filed in Korea on Mar. 18, 1999 under 35 U.S.C. § 119.

BACKGROUND OF THE INVENTION

1. Field of the Invention

The present invention relates to a semiconductor isolation structure and fabricating method therefor. Particularly, the present invention relates to a semiconductor isolation structure and a fabricating method in which the size of the active region is kept from decreasing because of an increase in the size of the isolating region, by utilizing a trench.

2. Description of Related Art

As the density of semiconductor devices increases, reducing the size of an isolating region in such semiconductor devices is more and more important.

Generally, a semiconductor device is isolated by applying the LOCOS (local oxidation of silicon) method. In the LOCOS method, a pad oxide layer is formed between a silicon nitride layer and a semiconductor substrate by thermal oxidation in order to relieve stress caused by different rates of thermal expansion between the semiconductor device and the silicon nitride layer. The silicon nitride layer is formed on the active region and is used as a hard mask. Further, a field insulating layer defines a device isolating region which is formed by oxidizing the field region of the semiconductor substrate not covered by the silicon nitride layer. The field insulating layer grows in the vertical direction and in the horizontal direction relative to the substrate because of an oxidant ($O_2$) diffusing along the pad oxide layer. Therefore, the field insulating layer grows under the pattern edge of the silicon nitride layer as well as on the field region.

The encroachment of the field insulating region into the active region is called a "bird's beak". The length of the bird's beak eventually becomes one half of the thickness of the field insulating region. Therefore, if the size of the active region is to be kept from decreasing, the bird's beak must be minimized.

In order to reduce the length of the bird's beak, a conventional method is known in which the thickness of the field insulating region is decreased. However, if the thickness of the field insulating region is reduced in a 16M DRAM or higher, then parasitic capacitance between the wiring layer and the semiconductor substrate increases. Therefore, the signal transmitting speed is lowered. Further, parasitic transistors are formed in the isolating regions due to the wiring of the gate. Accordingly, the threshold voltage $V_t$ is lowered, with the result that the device isolating characteristics deteriorate.

Therefore, conventional methods are known in which the length of the bird's beak is decreased, and at the same time, the device isolating characteristics are improved. One of these methods is PBLOCOS (poly Si buffered LOCOS), in which the, thickness of the stress absorbing pad oxide layer is reduced, and a poly crystalline silicon layer is inserted into between the semiconductor substrate and the silicon nitride layer. Another is SILO (sealed interface LOCOS) in which the side walls of the pad oxide layer are protected by a silicon nitride layer. A third one is recessed oxide LOCOS in which a recessed field insulating layer is formed on the field region of the semiconductor substrate.

However, in the above conventional methods, too precise a flatness and too precise a design rule are required to make these methods applicable to the 256M DRAM scale.

Therefore, in order to overcome the above problems, a BOX (buried oxide) type shallow trench isolation method is best known. In this method, a shallow trench is formed on the semiconductor substrate. Thereafter, a buried silicon oxide layer is deposited by a chemical vapor deposition method (CVD method). Therefore, the bird's beak is not formed, so the active region is not encroached. Further, the silicon oxide layer is buried into the trench and subsequently etched back, thereby obtaining a flat surface.

FIG. 1 is a sectional view showing an isolation structure according to the conventional art.

In this isolation structure, a field insulating layer 23 is formed within a trench 17 defining the isolating region of the semiconductor substrate 11. That is, CVD is used to deposit the field insulating layer 23 into the trench 17. For this purpose, after depositing an insulating layer 23 composed of silicon oxide or the like using CVD, the insulating layer is etched back so that the insulating layer 23 remains only within the trench 17.

That is, the trench 17 is filled with the field insulating layer 23 by applying a CVD process instead of an oxidation process. Therefore the formation of the bird's beak is prevented. Further, etching back is performed so as to make the silicon, oxide insulating layer 23 remain within the trench. A flat surface is therefore obtained.

FIGS. 2 to 5 illustrate a method for fabricating the above-described conventional isolation structure.

Referring to FIG. 2, a pad oxide layer 13 is formed on semiconductor substrate 11 by a thermal oxidation process. A silicon nitride layer 15 is formed on the pad oxide layer 13 by CVD. A photolithography process is then carried out to form a photolithographic pattern, so that predetermined portions of the pad oxide layer 13 and the silicon nitride layer 15 are removed to thereby expose the substrate 11. This defines a device isolating region I1 and an active region A1. By using the silicon nitride layer 15 as a mask, reactive ion etching (to be called "RIE" below) is carried out to form the trench 17.

Referring to FIG. 3, silicon oxide is deposited by CVD to fill the trench 17, thereby forming an insulating layer 19. Here, because of the height difference between the surface of the silicon nitride layer 15 and the bottom of the trench 17, a step is formed on the surface of the insulating layer 19.

A photoresist layer 21 is coated on the insulating layer 19. The photoresist layer 21 is patterned to expose locations corresponding to the silicon nitride layer 15 and to remain over locations corresponding to the trench 17 on the insulating layer 19. Then by using the patterned photoresist layer 21 as a mask, the exposed portions of the insulating layer 19 are etched. Here, the etched surface of the insulating layer 19 is roughly as high as the top of the trench 17.

Then, as shown in FIG. 4, the patterned photoresist layer 21 is removed. Then the insulating layer 19 is partially removed to expose the silicon nitride layer 15 by, for example, chemical-mechanical polishing process (to be called "CMP process" below).

Then, as shown in FIG. 5, a wet etching process is carried out to etch the pad oxide layer 13 and the silicon nitride layer 15 so as to expose the substrate 11. Under this condition, the upper portion of the insulating layer 19 is also removed so that it remains only within the trench 17. Furthermore, its surface becomes even with the substrate 11, thereby ensuring a flat surface. Thus the insulating layer 19 which remains within the trench 17 becomes a field insulating layer 23.

In this related art, when the pad oxide layer 13 is etched, the upper portion of the filled insulating layer 19 is also etched, and thus a field insulating layer 23 is formed. Under this condition, however, the insulating layer 19 is isotropically etched. Therefore, the field oxide layer is formed to collapse the field insulating layer at the portion which contacts the side wall of the trench. Due to the collapsed portion of the field insulating layer, when a subthreshold voltage is supplied, a hump phenomenon occurs. As a result, current leakage increases, and the refresh characteristics deteriorate. Further, the electric field is concentrated at the top edges of the trench. Therefore, the threshold voltage of the subsequently formed gate insulating layer becomes weak.

SUMMARY OF THE INVENTION

The present invention is intended to overcome the above-described disadvantages of the related art.

It is an object of the present invention to provide an isolation structure that avoids increased leakage currents and deterioration in refresh characteristics at a portion of the field insulating layer contacting the side wall of the trench.

It is another object of the present invention to provide an isolation structure that avoids deterioration of the threshold voltage characteristic of the gate insulating layer.

It is still another object of the present invention to provide a fabricating method for an isolation structure that avoids collapse of the portion of the field insulating layer contacting the side wall of the trench.

In achieving the above objects, an isolation structure according to the present invention includes: a semiconductor substrate having a trench defining an isolating region and an active region of the semiconductor substrate; and first, second, and third insulating layers deposited in the trench, the second insulating layer being composed of a material with an etch selection ratio different from those of the first and third insulating layers.

In another aspect of the present invention, the fabricating method for an isolation structure according to the present invention includes: forming a masking layer on a semiconductor substrate to expose an isolated region; forming a trench in this exposed region; depositing a first insulating layer within the trench, leaving a remaining portion of the trench unfilled; removing the masking layer; forming a second insulating layer over exposed side walls of the trench and the surface of the first insulating layer, where the second insulating layer is composed of a material with an etch selection ratio different from that of the first insulating layer; forming a poly crystalline silicon layer upon the second insulating layer to fill the vacant portion of the trench; oxidizing the poly crystalline silicon layer to form a third insulating layer so as to make it project and so as to cover the top edges of the trench; and removing the exposed portions of the second insulating layer.

In still another aspect of the present invention, the fabricating method according to the present invention includes: forming a masking layer on a semiconductor substrate to expose an isolating region; forming a trench in the region thus exposed; forming a first insulating layer within the trench, leaving a remaining portion of the trench unfilled; removing the masking layer; forming a second insulating layer over the exposed side walls of the trench and over the surface of the first insulating layer, where the second insulating layer is composed of a material with an etch selection ratio different from that of the first insulating layer; forming a silicon oxide layer upon the second insulating layer and over the substrate; and etching back the silicon oxide layer to form a third insulating layer, where the third insulating layer fills the remaining vacant portion of the trench, and where the edges of the second insulating layer are exposed.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1:
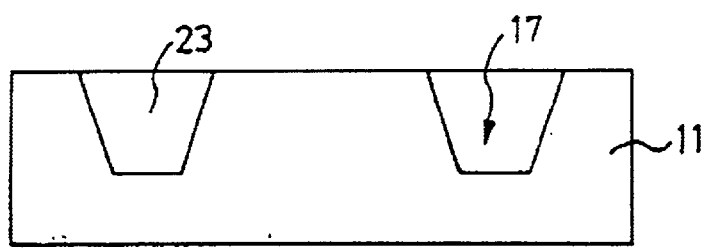
FIG. 1 is a sectional view showing a conventional isolation structure.
Figure 2:
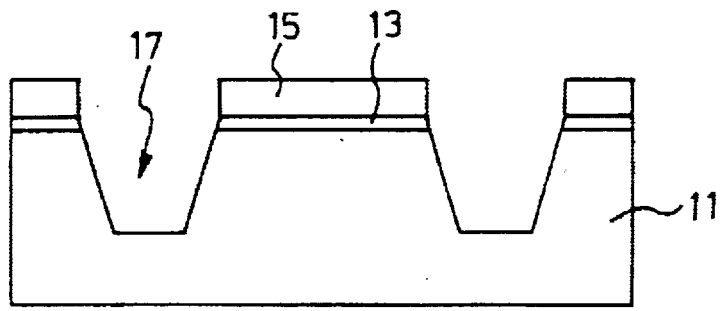
FIGS. 2 to 5 illustrate a method for fabricating the conventional isolation structure.
Figure 3:
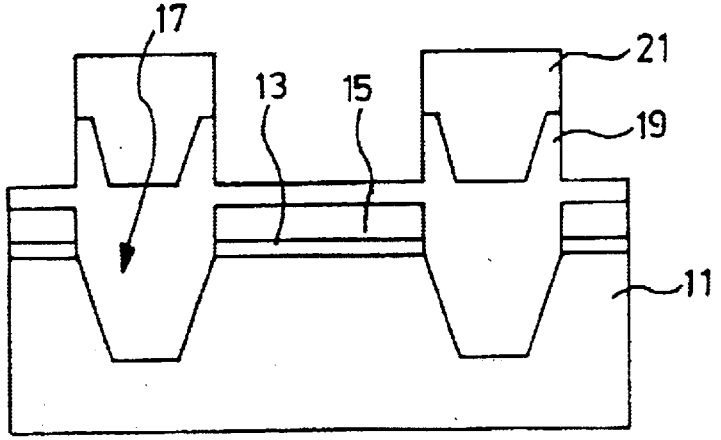
Figure 4:
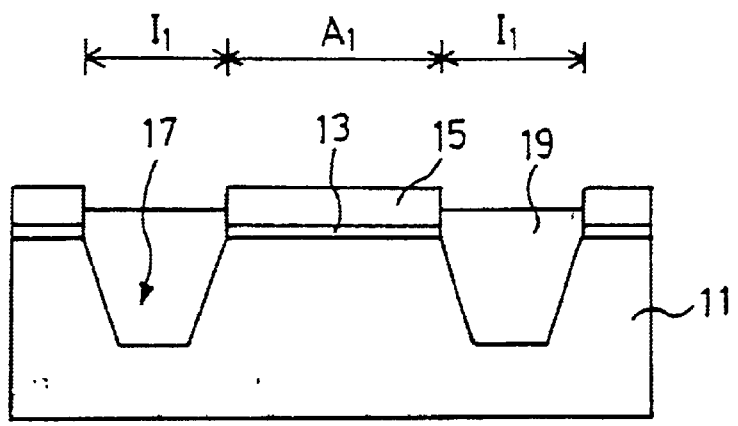
Figure 5:
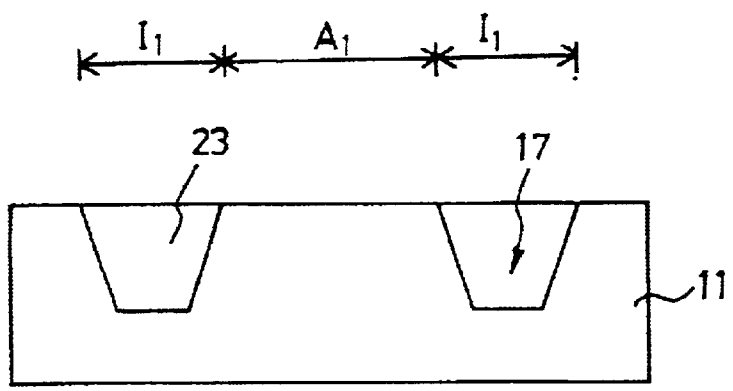
Figure 6:
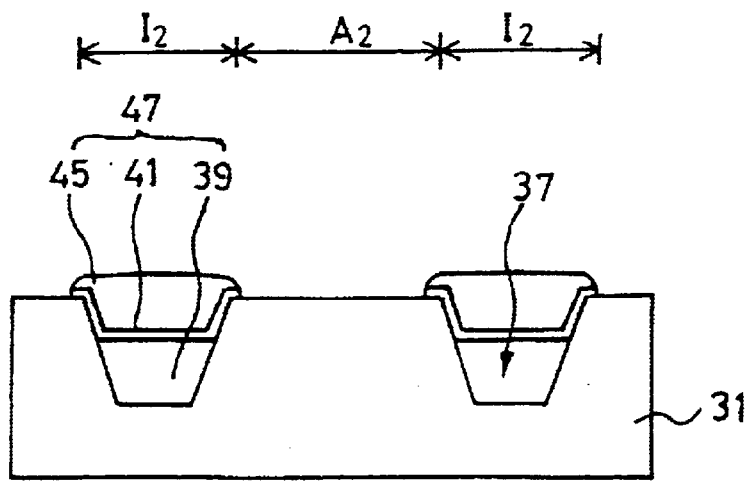
FIG. 6 is a sectional view showing an isolation structure according to the present invention.

FIG. 6 is a sectional view showing an isolation structure according to the present invention.

In the isolation structure according to the present invention, a field insulating layer 47 is formed by depositing insulating materials into a trench 37 defining an active region A2 of a semiconductor substrate 31.

The trench 37 is formed in the isolating region 12, for defining an active region A2 of the substrate 31. This trench 37 is formed to a depth of 2500–5000 Å by an anisotropic etching such as an RIE process or the like.

The field insulating layer 47 consists of first, second and third insulating layers 39, 41 and 45 which are stacked in the trench 37. The first and third insulating layers 39 and 45 are composed of silicon oxide, but the second insulating layer 41 is silicon nitride, which has a different etch rate from that of the third insulating layer 45.

In the above, the first insulating layer 39 is deposited into the trench 37 by the CVD process. Then an etch-back using a CiP or RIE process is carried out so that the upper portion (500–1500 Å) of the first insulating layer 39 in the trench 37 is removed. Then the second insulating layer 41 is deposited in the trench 37 to a thickness of about 50–150 Å by the CVD process so as to cover the exposed side walls of the trench 37 and the surface of the first insulating layer 39 and the substrate 31. Then a third insulating layer 45 is formed, and then the exposed portions of the second layer 41 are etched away.

Specifically, the third insulating layer 45 is formed by oxidizing a poly crystalline silicon deposited in the remaining vacant portion of the trench 37, up to the surface of the substrate 31 and over the second insulating layer 41. The third insulating layer 45 is completed by oxidizing the poly crystalline silicon. When poly crystalline silicon is oxidized, its volume expands by about 60–70%. Therefore, the third insulating layer 45 expands vertically to project 300–1000 Å above the substrate 31 to form a step. Third insulating layer 45 also horizontally expands to cover the edges of the top of the trench 37.

Therefore, the portion of the third insulating layer 45 which contacts the tope edge of the trench 37 does not collapse. When a subthreshold voltage is applied, the hump phenomenon therefore does not occur. Consequently, leakage current does not increase, and the refresh characteristic is not negatively affected. Further, the third insulating layer 45 covers the top edges of the trench 37. Therefore, a gate insulating layer (not shown) which is formed later is not so thin that its threshold voltage characteristic is not weakened. During the thermal oxidation for forming the third insulating layer 45, the second filled insulating layer 41 prevents the substrate 31 from being oxidized.

As discussed above, the third insulating layer 45 is formed by thermally oxidizing the poly crystalline silicon layer deposited into the remaining vacant portion of the trench 37. In another embodiment of the present invention, silicon oxide is deposited upon the second insulating layer 41, and an etch-back is carried out until the second filled insulating layer 41 is exposed.

FIGS. 7 to 10 illustrate a method for fabricating an isolation structure according to the present invention.

Figure 7:
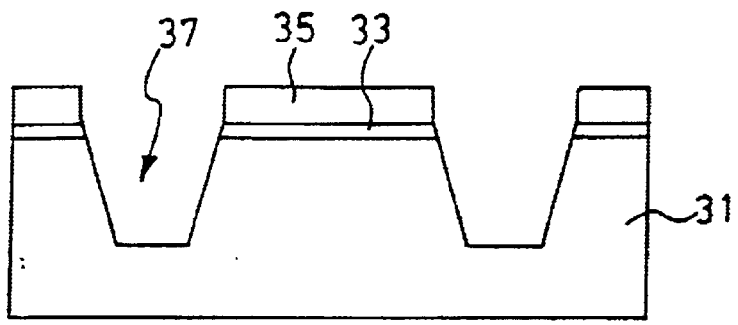
FIGS. 7 to 10 illustrate a method for fabricating the isolation structure according to the present invention.

Referring to FIG. 7, a pad oxide layer 33 is formed to a thickness of about 100–200 Å upon a semiconductor substrate 31 by a thermal oxidation process. A silicon nitride layer 35 is formed to a thickness of about 1000–2000 Å upon the pad oxide layer 35 by the CVD.

Then a photolithography process is carried out to pattern a predetermined portion of the pad oxide layer 33 and the silicon nitride layer 35 until the substrate 31 is exposed. Thus a device isolating region 12 and an active region A2 are defined. Using the silicon nitride layer 35 as a mask, the exposed portions of the substrate 31 are etched by a reactive ion etching (RIE) process using an etching gas, for example, including chlorine, thereby forming a trench 37.

Figure 8:
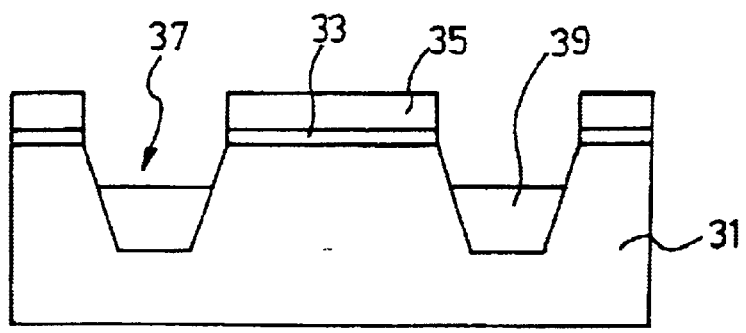

Referring to FIG. 8, a first insulating layer 39 is deposited within the trench 37. The first insulating layer 39 is formed by the CVD process upon the silicon nitride layer 35, in such a manner that silicon oxide partially fills the trench 37, leaving the upper 500–1500 Å of the trench vacant. Accordingly, a portion of the side walls of the trench 37 not covered by the first insulating layer 39 remains exposed.

Figure 9:
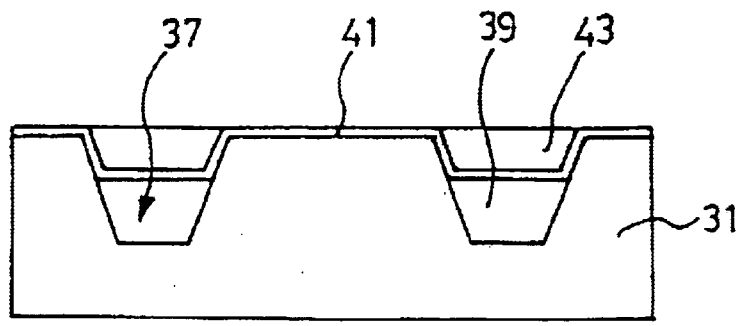

Referring to FIG. 9, the pad oxide layer 33 and the silicon nitride layer 35 are removed by using, for example, a fluoric acid solution (HF) and a phosphoric acid solution ($H_2PO_4$). Then silicon nitride is deposited to a thickness of about 50–150 Å by a CVD process to cover the exposed side walls of the trench 37 and the surface of the first insulating layer 39, thereby forming a second insulating layer 41.

Then a poly crystalline silicon layer 43 is deposited into the remaining vacant portion of the trench 37 over the second layer 41. The CVD process is used in depositing the poly crystalline silicon into remaining vacant portions of the trench 37, thereby forming a poly crystalline silicon layer 43. Then an etch-back process such as CMP or RIE is carried out to planarize the surface of the structure, so that the poly crystalline silicon layer 43 remains only within the trench 37, and so that the second insulating layer 41 is exposed. Therefore, the poly crystalline silicon layer 43 has a thickness of about 500–1500 Å. The second insulating layer 41 characteristically has a different etch rate from that of silicon. It is therefore utilized as an etch stop layer to prevent the substrate 31 from being damaged.

Figure 10:
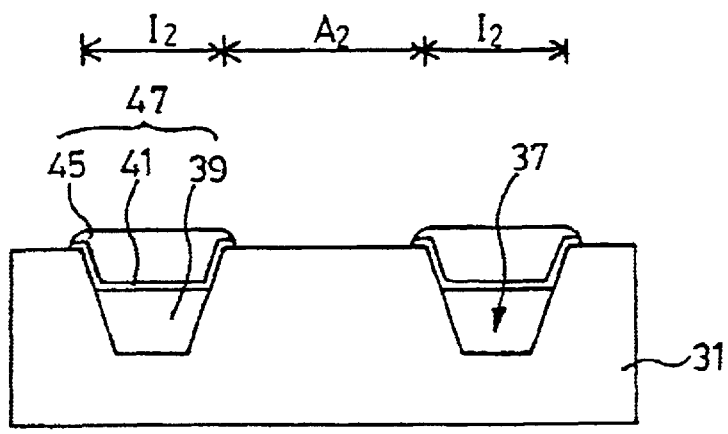

Referring to FIG. 10, the poly crystalline silicon layer 43 is thermally oxidized to form a third insulating layer 45. When the poly crystalline silicon layer is oxidized, its volume expands by about 60–70%. The third insulating layer 45 therefore not only vertically expands to form a step about 300–1000 Å high relative to the surface of the substrate, but also horizontally expands to cover the top edges of the trench 37. Therefore, the edge portions of the third insulating layer 45 do not collapse. When oxidizing the poly crystalline silicon layer 43, the second insulating layer 41, acting as an etch stop layer, acts to prevent the substrate 31 from being oxidized.

The second insulating layer 41 is then selectively etched by using, for example, a phosphoric acid solution ($H_2PO_4$) to expose the portions of the substrate 31. Because the third insulating layer 45 has a different etch rate from that of the second insulating layer 41, and the third insulating layer 45 is not etched, the collapse is avoided.

The above-described first, second and third insulating layers 39, 41 and 45 collectively form a field insulating layer 47.

Figure 11:
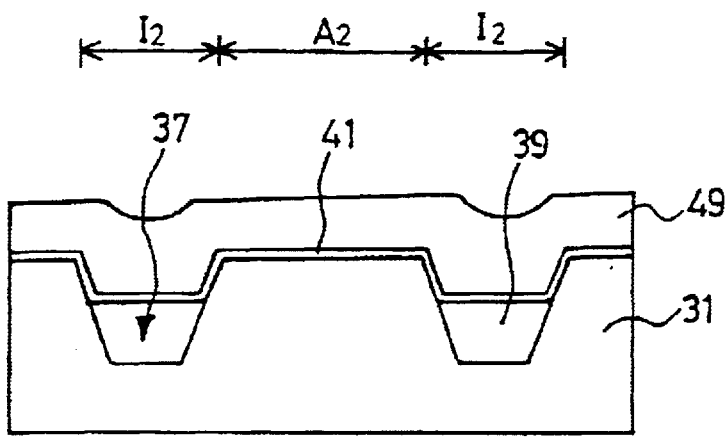
FIGS. 11 to 12 illustrate a method for fabricating the isolation structure according to another embodiment of the present invention.
Figure 12:
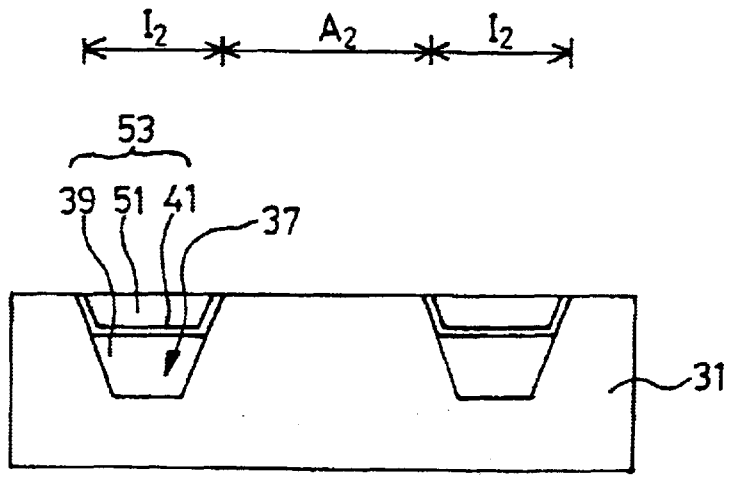

FIGS. 11 and 12 illustrate a method for fabricating an isolation structure according to another embodiment of the present invention. In this embodiment, elements having the same constitutions and functions as those of the first embodiment will be assigned with the same reference numbers.

Referring to FIG. 11, after carrying out the step illustrated in FIG. 8, the pad oxide layer 33 and the silicon nitride layer 35 are respectively removed by using, for example, a fluoric acid solution (HF) and a phosphoric acid solution ($H_2PO_4$).

A CVD process is then carried out to deposit a silicon nitride layer with a thickness of 50–150 Å so that the exposed side walls of the trench 37 and the surface of the first insulating layer 39 are covered, thereby forming a second insulating layer 41. Then a silicon oxide layer is deposited upon the second layer 41 by, for example, a CVD process to form a silicon oxide layer 49.

Referring to FIG. 12, the silicon oxide layer 49 is etched back by, for example, a CMP or RIE process until the second insulating layer 41 is exposed, thereby forming a third insulating layer 51. The second insulating layer 41 has a different etch rate from that of the silicon oxide of the third insulating layer 51. Therefore, it functions as an etch stop layer so that damage to the substrate 31 is prevented. Further, the surface of the third insulating layer 51 is planarized by etching back the silicon oxide layer 49.

The second insulating layer 41 is selectively etched by using, for example, a phosphoric acid solution or the like until the substrate 31 is exposed. Under this condition, the third insulating layer 51 has an etch selection ratio different from that of the second insulating layer 41. Therefore, its edge portions do not collapse.

The above-described first, second and third insulating layers 39, 41 and 51 collectively form a field insulating layer 53.

According to the present invention as described above, the edge portions of the third insulating layer 51 (where they contact the side walls of the trench 37) do not show any collapse. Therefore, when a subthreshold voltage is applied, the hump phenomenon does not occur. As a result, the leakage current does not increase, and the deterioration of the refresh characteristic can be prevented. Further, the third insulating layer 51 covers the top edges of the trench 37. Therefore, the later-formed gate insulating layer has a sufficient thickness to prevent deterioration of yield voltage characteristics.

What is claimed is:

1. An isolation structure for a semiconductor device, comprising:

a semiconductor substrate having a trench formed therein defining an active region;

a field insulating layer formed in said trench and comprising first, second, and third insulating layers, wherein said second insulating layer has an etch selection ratio different from that of said first and third insulating layers, wherein said third insulating layer projects laterally relative to said trench, whereby respective edges of said trench at a surface of said semiconductor substrate are covered by said third insulating layer.

2. The isolation structure of claim 1, wherein said first and third insulating layers are silicon oxide.

3. The insulation structure of claim 1, wherein said first insulating layer only partially fills said trench.

4. The isolation structure of claim 1, wherein said third insulating layer projects above a surface of said semiconductor substrate.

5. The isolation structure of claim 1, wherein said second insulating layer is made from silicon nitride.

6. The isolation structure of claim 3, wherein said second insulating layer covers said first insulating layer and side walls of said trench left exposed by said first insulating layer.

7. The isolation structure of claim 6, wherein said third insulating layer projects above a surface of said semiconductor substrate.

* * * * *